Figure 1:
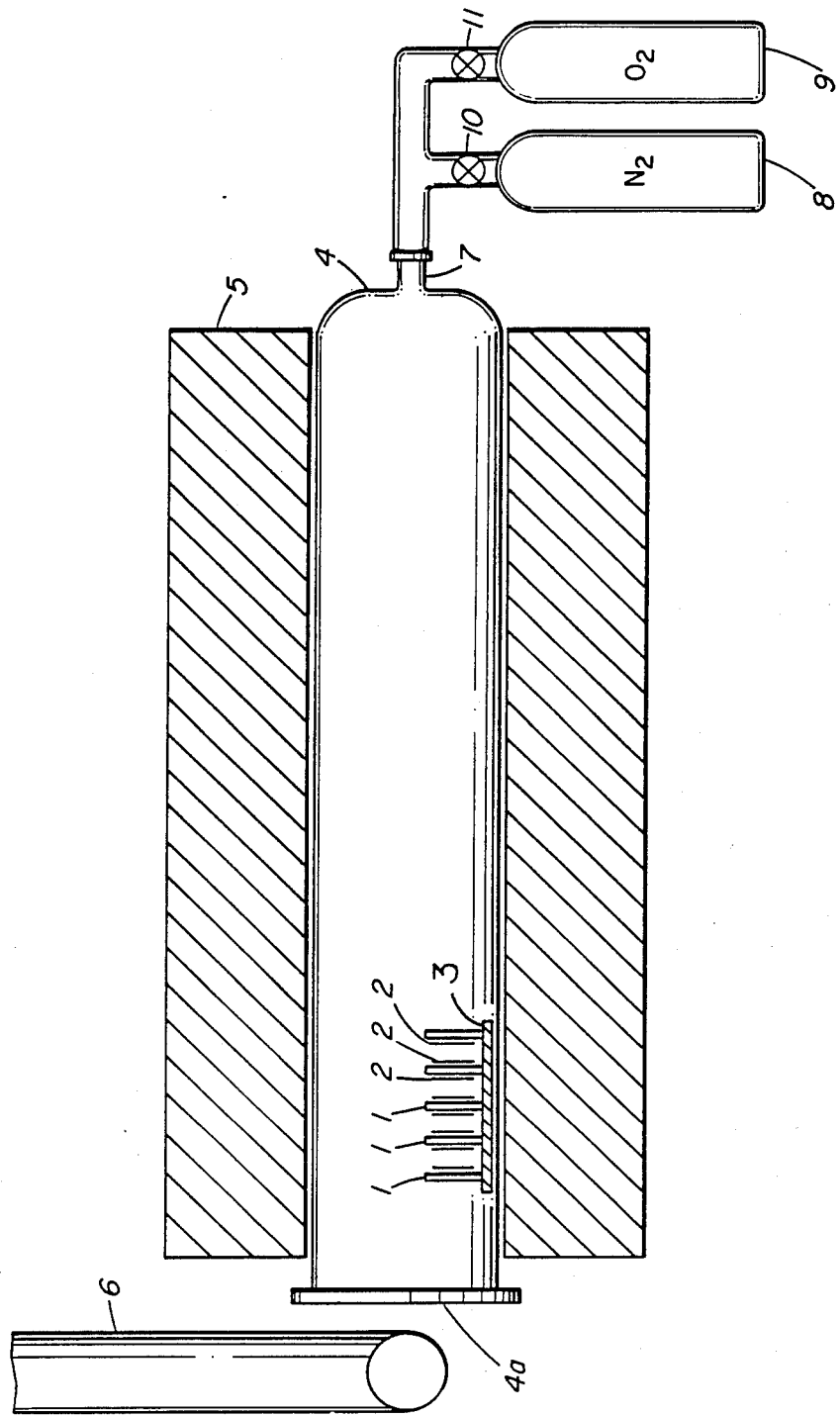

United States Patent [19]

Plante

[11] Patent Number: 4,857,480

[45] Date of Patent: Aug. 15, 1989

[54] METHOD FOR DIFFUSING P-TYPE MATERIAL USING BORON DISKS

[75] Inventor: Manon Plante, St. Alphonsede Granby, Canada

[73] Assignee: Mitel Corporation, Ontario, Canada

[21] Appl. No.: 112,147

[22] Filed: Oct. 26, 1987

[30] Foreign Application Priority Data

Oct. 29, 1986 [CA] Canada ................................ 521720

[51] Int. Cl.$^4$ .......................................... H01L 21/385
[52] U.S. Cl. ...................................... 437/168; 437/169
[58] Field of Search ............................... 437/168, 169

[56] References Cited

U.S. PATENT DOCUMENTS

| | | | |
|---|---|---|---|
| 3,374,125 | 3/1968 | Goldsmith | 437/168 X |
| 3,530,016 | 9/1970 | Joseph | 437/168 |
| 3,644,154 | 2/1972 | Hoogendoorn et al. | 437/168 |
| 3,755,017 | 8/1973 | Coughlin | 437/169 |
| 3,849,344 | 11/1974 | McMartry et al. | 437/168 X |
| 3,939,017 | 2/1976 | Ryugo et al. | 437/168 |
| 3,948,695 | 4/1976 | Ryugo et al. | 437/169 X |
| 3,948,696 | 4/1976 | Inaniwa et al. | 437/169 |
| 3,997,351 | 12/1976 | Vergano | 437/168 X |
| 4,734,386 | 3/1988 | Kubota | 437/169 X |

FOREIGN PATENT DOCUMENTS

721882 11/1965 Canada .
59-177923 10/1984 Japan ..................................... 437/169

Primary Examiner—Olik Chaudhuri
Attorney, Agent, or Firm—Antonelli, Terry & Wands

[57] ABSTRACT

A method of depositing P-type material on one or more semiconductor substrate wafers in a MOSFET fabrication process, utilizing boron disks. The boron disks are passivated by exposing them to nitrogen gas within a reaction chamber, and then subsequently oxidized by flowing gaseous oxygen thereover. P-type material is diffused from the boron disks onto the surface of the wafers by flowing nitrogen gas over the disks and wafers within the reaction chamber, and subsequently flowing a mixture of nitrogen and oxygen gas over the disks and wafers at a predetermined temperature and flow rate, and for a predetermined length of time. The wafers produced according to the method of the present invention are characterized by high yield, few surface or near-surface defects, and uniform P+ sheet resistance. The method is substantially less expensive to implement than prior art ion implantation techniques for fabricating MOS devices.

18 Claims, 1 Drawing Sheet

METHOD FOR DIFFUSING P-TYPE MATERIAL USING BORON DISKS

This invention relates in general to semiconductor fabrication, and more particularly to the use of boron disks as a source of P-type material during a fabricating process of complementary metal oxide semiconductor (CMOS) field effect devices.

Diffusion techniques have been utilized for many years to fabricate bipolar and metal-oxide-semiconductor (MOS) devices. Prior art diffusion techniques can be divided into three well known categories: solid state, liquid source, and ion implantation. According to each of the categories, a two step procedure is followed for doping P-type material into a silicon substrate wafer.

According to the first step, called predeposition, the silicon wafers are heavily doped with a P-type material from one of either a solid state source, liquid source, or high energy ion beam. Prior art solid state sources were typically in the form of a plurality of boron nitride wafers arranged alternately with silicon substrate wafers on a quartz boat. Prior art liquid sources were typically in the form of a gaseous dopant such as $BB_{r3}$ introduced into a reaction chamber such as a silica tube enveloping a quartz boat on which the substrate wafers are disposed.

Elemental boron is formed by means of a surface reaction between $B_2O_3$ (boron trioxide) and the silicon substrate. The elemental boron formed diffuses into the silicon forming a doped layer having a surface concentration of boron corresponding to the solid solubility limit at the temperature of the silicon substrate. If excessive amounts of $B_2O_3$ are present, a surface layer of boron rich silicon boride is formed. This layer, called the boron skin can be several hundred angstroms thick.

According to the second step, known variously as low temperature oxidization, diffusion, or annealing, the dopant is diffused into the substrate to a predetermined depth, by heating the wafers in an oxidizing ambient atmosphere. Diffusion furnaces, graphite reactors, and high energy bright lamps are some of the well known means for heating the wafers.

An inert gas such as $N_2$ is typically introduced into the reaction chamber along with oxygen ($O_2$) such that the silicon beneath the boron skin becomes oxidized and the skin can be subsequently removed by undercutting in hydrofluoric acid. Also, the oxygen prevents pitting of the exposed silicon substrate surface by energetic $N_2$ molecules, and the heating of the substrate effectively anneals any damage to the wafers.

Prior art metal-oxide-semiconductor (MOS) processes have typically used ion implantation of P-type dopant in the above described first step. In operation, a beam of impurity ions is accelerated to high energies and directed onto the surfaces of the silicon wafers for implanting impurities at predetermined penetration depths therein.

The first application of ion implantation to receive wide acceptance was for the adjustment of of P-channel MOS transistor threshold voltages. Since the threshold (turn-on) voltage of MOS transistors is a function of the substrate doping immediately under the gate region of the transistor, ion implantation of P-type impurities through the gate oxide can be used to lower the threshold voltage of the transistor to more desirable levels. It was then found that by including a second implant step, together with a photoresist operation, both enhancement mode (normally off) and depletion mode (normally on) transistors could be fabricated on the same chip, which results in considerable latitude in circuit design.

Ion implantation has been particularly successful in the fabrication of NMOS integrated circuits. The fixed surface charge density of the oxide on such circuits is sometimes sufficient to invert the surface of the lightly doped P-type silicon used as the substrate. Therefore, ion implantation is commonly used to place sufficient P-type impurity just under the oxide/silicon interface to offset the effect of the surface charge density. This process also utilizes a separate phosphorus implant to produce both depletion mode and enhancement mode transistors on the same wafer, as discussed above.

Furthermore, ion implantation has been successfully used as a predeposition source in the preparation of P wells for CMOS transistors.

However, ion implanters are complex machines utilizing sophisticated technology. Accordingly, ion implantation is a substantially more expensive approach to semiconductor doping than the prior art solid state or liquid state diffusion techniques. Also, ion implantation suffers from additional disadvantages, such as damage to the silicon crystalline structures resulting from high energy ion bombardment.

In most NMOS processes, the principle dopant is phosphorus. Thus, in the majority of MOS fabrication facilities, it has not been previously considered to develop a boron doping method which gives the required shallow junctions and high resistivities needed to fabricate MOS devices. This is as a result of an historical industry bias toward ion implantation, and certain prejudices against solid state diffusion.

For instance, boron nitride wafers utilized in bipolar fabrication are prohibitively sensitive to moisture contamination. They are also susceptible to ionic contamination due to sodium, lithium, potassium, etc., and when stacked in transit and during storage, prior to use, they are susceptible to particulate contamination.

Bipolar devices operate in the bulk of the silicon, whereas MOS devices operate at the surface of the silicon. Therefore, research into fabrication of bipolar processes has concentrated on developing deep junctions which is difficult without an enormously powerful ion implantation device. Thus, the natural choice for fabrication of bipolar devices has been solid state diffusion, and the natural choice for fabrication of shallow junction MOS devices has been ion implantation.

According to the present invention, a method is provided for diffusing a P-type impurity from a solid state source material, in the form of a bdron disk, into a semiconductor substrate in order to fabricate a MOS device characterized by shallow junctions with uniform low P+sheet resistance, as an alternative to well known ion implantation.

Boron disks such as those sold by the Emulsitone Company of New Jersey, U.S.A., under the name Borodisc*, are a direct replacement for prior art boron nitride wafers, and are used primarily in the fabrication of large geometry bipolar devices.

*trademark

In its most general form, the method according to the present invention comprises the steps of preparing one or more boron disks containing the P-type impurity by first performing a passivating step and then an oxidizing step. Thereafter, the disks can be stored prior to diffusion. While in storage, the oxidizing step should be repeated periodically to ensure that sufficient oxide is maintained on the surface of the disks.

During diffusion, the disks are first loaded with one or more substrate wafers onto a quartz boat within a reaction chamber, and a gaseous mixture of nitrogen and oxygen is flowed over the disks and wafers at a predetermined temperature and for a predetermined length of time, whereby the P-type boron material diffuses from the disks into the surface of the substrate wafers.

According to a preferred embodiment, the aforementioned passivating step is comprised of the steps of loading the disks on a quartz boat within the reaction chamber, and exposing the disks to nitrogen gas at a predetermined flow rate and temperature for a predetermined length of time, whereby the boron contained in the disks is caused to flow at the surfaces thereof, and any moisture is removed therefrom.

Also, the aforementioned oxidizing step is preferably comprised of the steps of exposing the passivated disks to oxygen gas at a predetermined flow rate and temperature, and for a predetermined length of time, whereby a boron rich oxide layer is developed on the surfaces thereof.

A better understanding of the present invention will be obtained with reference to the detailed description below in conjunction with the following drawing, in which:

FIG. 1 is a cross-section elevational view illustrating apparatus for performing the method according to the present invention.

Boron disks, such as those manufactured by the Emulsitone Company, are composed of $B_2O_3/BN/SiO_2$, deposited on a P-type silicon wafer. The boron disks are typically packaged into four different containers, two of which are hermetically sealed. Because the boron disks are well packaged, it is usually not necessary to wash them prior to use, which is a procedure required prior to using well known boron nitride wafers.

With reference to FIG. 1, showing a diffusion apparatus illustrative of the type in which an embodiment of the method according to the present invention is practiced, a plurality of boron disks 1 are arranged on a standard quartz boat 3 enclosed within a reaction chamber 4, such as a silica tube, which is inserted into a furnace 5.

A quartz plate 4a is fitted at an end of the tube 4, and holes (not shown) are disposed in the plate for allowing spent gases to pass out of the tube for removal via an exhaust fan (not shown) through an exhaust chimney 6.

The disks 1 are arranged on the quartz boat 3 with a predetermined number of slots (e.g., 3 slots) left between each one. Hence, for example, in a boat with fifty slots, thirteen boron disks are placed thereon with three empty slots between each disk. A maximum of typically four boats may be inserted in the tube 4, (although five or even six boats could be used, suitable modifications being made to the structure of the boats 3 and furnace 5.

The boron disks are then exposed to a passivation cycle at preferably 1020° C. in an $N_2$ atmosphere flowing at a rate of 4.0 slpm (standard litres per minute) for approximately forty-five minutes. The nitrogen gas ($N_2$) is stored in a tank 8 and admitted to the reaction chamber 4 via valve 10 and inlet 7. Vitreous boron glass is caused to flow at the surface of the disks thereby evening out the surface of the doping material and removing moisture that may have been deposited thereon.

The passivation cycle is then followed by an oxidization cycle comprised of exposing the passivated disks at preferably 1020° C., to an $O_2$ atmosphere flowing at a rate of 4.0 slpm which causes a boron rich oxide layer to be grown on the surface of the disks. The oxygen gas ($O_2$) is stored in a tank 9 and admitted into the reaction chamber 4 via valve 11, through inlet 7.

For storage, the boron disks are preferably loaded into the tube 4 and exposed to an $N_2$ atmosphere flowing at approximately 8.0 slpm, at a temperature of 50° C.

During the diffusion process, the boron disks 1 and silicon wafers 2 are arranged on the boat 3, as illustrated in FIG. 1, such that the silicon wafers are situated on opposite sides of both faces of the boron disks. The boat is inserted into the tube or reaction chamber 4 under software control, in a step lasting typically 7 to 8 minutes, and a constant $N_2$ gas flow of approximately 4 slpm (standard litres per minute), is introduced via inlet 7 and maintained throughout the subsequent diffusion steps.

Next, an approximately 10 minute temperature stabilization period ensues, followed by heating of the silica tube via the furnace 5, from a temperature of approximately 800° C. to 1020° C. over a period of approximately 28 minutes.

The temperature is maintained at 1020° C. and $O_2$ gas is then introduced into the silica chamber via inlet 7 at a flow rate of 40 sccm (standard cubic centimeters per minute), for a length of time equal to approximately 35 minutes, but variable by 5 minute increments in order to vary the sheet resistance of the silicon wafers in a controlled manner. The majority of boron is transferred from the boron disks to the silicon wafers during this last described step.

Next, the temperature is ramped downwardly from 1020° C. to 800° C., in a step that lasts approximately 55 minutes. The $O_2$ gas flow is maintained throughout the temperature ramp down step.

Next, the wafers are left to cool within the quartz tube for a period of approximately 10 minutes in the combined nitrogen and oxygen atmosphere, to allow the wafers to approach a temperature closer to room temperature prior to being handled by operators.

Prior to removal of the wafers from the furnace, the oxygen and nitrogen gas flows are terminated.

Experimental results have indicated that a temperature of approximately 1020° C., and proportions of 99% $N_2$ and 1% $O_2$ are preferable for obtaining substrate sheet resistances of from between 14.0 to 22.0 ohms/square, having a standard deviation of from 0.1 to 0.6 ohms/square.

As discussed, the initial portion of the deposition cycle is preferably performed in pure nitrogen ($N_2$) instead of a nitrogen/oxygen mixture. With no oxygen present in the early part of the cycle, (i.e., until the temperature reaches 1020° C.) the boron disks do not become substantially oxidized, and little doped oxide is transported to the surface of the silicon wafers. Therefore, the silicon wafers do not become heavily doped and the sheet resistance is high yet uniform, resulting in low percent standard deviation of sheet resistance at low doping levels.

A diffusion cycle time of 150 minutes is preferred, of which the actual doping time is approximately 35 minutes at 1020° C., the remaining time being spent at approximately 800° C., or temperatures between 800° C. and 1020° C.

The temperatures discussed (i.e., 800° C. to 1020° C.) represent the average temperature in the silica tube 4. This can vary from one end of the tube to the other during the cycle, depending on many factors. The major temperature variations occur during loading and unloading of the boats 3 from the tube. During the loading operation, the insertion of cold silicon wafers and boron disks causes the temperature to drop at the mouth of the tube, 4A. When the wafers are unloaded from the tube, the opening of the door causes temperature to drop at the mouth of the tube. However, the passage of the hot wafers exiting the tube causes a compensating rise in temperature. Thus, the temprature discussed above is typical of the center of the tube.

An alternative to introducing the oxygen gas flow only after the temperature within the tube has reached 1020° C., is to introduce the oxygen at the beginning of the cycle and maintain the flow thereof at all times throughout the cycle, as discussed above with reference to the nitrogen gas flow. However, as discussed above, by introducing the oxygen gas flow instantaneously upon the temperature reaching 1020° C., lower percent standard deviation is obtained in the sheet resistance at low doping levels.

It has been found that a distance of 0.09 inches between each boron disk and adjacent semiconductor wafer produces good sheet resistance results. For example, at the aforementioned temperature of 1020° C. and the aforementioned proportions of 99% $N_2$ and 1% $O_2$, a mean standard deviation in sheet resistance of 0.68 ohms/square was obtained.

Experiments for comparing device characteristics fabricated according to the method of the present invention as well as the prior art methods utilizing boron nitride wafers yielded promising results.

For examplewhereas MOS devices fabricated utilizing prior art boron nitride wafers were characterized by a mean final P+ sheet resistance of 75 ohms/square at a standard deviation of 17 ohms/square, the P+ sheet resistance for a device fabricated utilizing boron disks according to the method of the present invention were characterized by a mean final P+ sheet resistance of 70 ohms/square and standard deviation of only 5 ohms/square. Experimental fabrication of wafers utilizing boron disks resulted in an average sheet resistance after diffusion of 14.874 ohms/square and standard deviation of 0.07 ohms/square immediately after diffusion (i.e., prior to subsequent addition of thermal processing) while devices fabricated utilizing boron nitride wafers were characterized by a sheet resistance after diffusion, of 14.635 ohms/square and a standard deviation of 0.48 ohms/square.

Furthermore, the wafers fabricated using boron disks were found to have a defect density of approximately two orders of magnitude less than those fabricated utilizing boron nitride wafers.

The ion implantation process results in devices having similar sheet resistances and standard deviations as in the present invention, yet as discussed above, is much more complicated and expensive to implement. Further experiments resulted in the discovery that device yield as between the method according to the present invention and the pior art ion implantation technique, is identical, yet the standard deviation is significantly larger for the implanted wafers. Accordingly, both boron disks and ion implantation work well for P+ predeposition yet the boron disks have the advantage of less deviation in the device yield.

In summary, hhe method of utilizing boron disks for predeposition of P-type material on semiconductor substrates enjoys a number of advantages over the prior art method using boron nitride wafers. For instance, the time required to prepare the boron disks prior to diffusion is substantially less than that required when utilizing boron nitride wafers since the boron disks are not required to be washed prior to use, and a very short passivation cycle (45 minutes) is required, whereas boron nitride wafers typically require an approximately 120 hour passivation cycle at 1020° C.

Thus, whereas boron nitride wafers are required to undergo predeposition preparation lasting typically several days, the passivation and oxidization cycles performed on the boron disks according to the present invention, can all be carried out in a matter of hours.

Also, whereas boron nitride wafers are very sensitive to moisture and ionic contamination, it has been found that boron disks are not.

When utilizing boron disks, a low temperature oxidization cycle is not necessary since unetchable glaze is typically not developed on the boron disks prior to diffusion according to the present invention. The careful packaging in which the boron disks are typically received preserves them from most external contaminants during transportation and storage. Consequently, the P-type sheet resistance uniformity can be accurately controlled.

A person understanding the present invention may conceive of other modifications or variations therein. For instance, while a boat 3 was discussed above having 50 slots, boats having fewer or greater than 50 slots may be used. Also, whereas four boats were indicated as being loaded into the tube 4 fo a given deposition cycle, five or even six boats could be used, as discussed above.

All such variations and modifications are believed to be within the sphere and scope of the present invention as defined in the claims appended hereto.

I claim:

1. In a process of fabricating metal oxide silicon field effect devices in wafers of silicon semiconductor substrate, a method of depositing P-type material on one or more of said wafers comprising the steps of passivating one or more boron disks in the absence of said wafers, oxidizing said disks in the absence of said wafers, then subsequently flowing nitrogen gas over said disks and wafers within a reaction chamber while raising the termperature of the chamber to a diffusion temperature, and thereafter flowing a gaseous mixture of nitrogen and oxygen over said disks and wafers at said diffusion temperature whereby P-type material from said boron disks is deposited onto the surface of said wafers for diffusion therein.

2. A method as defined in claim 1, wherein said passivating step is comprised of exposing said disks to a flow of nitrogen gas within said reaction chamber, at said diffusion temperature, for a length of time sufficient to cause boron within said disks to flow at the ufaes thereof and moisture removed therefrom.

3. A method as defined in claim 2, wherein said oxidizing step is comprised of exposing said disks to oxygen gas within said reaction chamber at said diffusion terperature, for a length of time sufficient to cause a boron rich oxide layer to develop on the surface of said passivated disks.

4. A method as defined in claim 1, wherein said boron disks are comprised of $B_2O_3/BN/SiO_2$ deposited on a silicon wafer, said diffusion temperature is approximately 1020° C., and said gaseous mixture is comprised of approximately 99% $N_2$ and 1% $O_2$.

5. A method as defined in claim 2, wherein said boron disks are comprised of $B_2O_3$/BN/$SiO_2$ deposited on a silicon wafer, said diffusion temperature is approximately 1020° C., and said gaseous mixture is comprised of approximately 99% $N_2$ and 1% $O_2$.

6. A method as defined in calim 3, wherein said boron disks are comprised of $B_2O_3$/BN/$SiO_2$ deposited on a silicon wafer, said diffusion temperature is approximately 1020° C., and said gaseous mixture is comprised of approximately 99% $N_2$ and 1% $O_2$.

7. A method as defined in claim 1, wherein the lengths of time for which firstly nitrogen gas and then said gaseous mixture of nitrogen and oxygen are flowed over said disks and wafers, is a total of approximately 150 minutes.

8. A method as defined in claim 1, wherein each of said boron disks and substrate wafers is disposed on a quartz boat within said reaction chamber, and said disks and wafers are separated from one another on said boat by a distance of approximately 0.09 inches.

9. A method as defined in claim 1, further including the step of storing said disks at a temperature of 50° C. in an $N_2$ atmosphere flowing at a rate of approximately 8.0 slpm prior to performing said diffusion step.

10. A method as defined in claim 2 wherein the length of time for performing said passivating cycle is approximately forty-five minutes.

11. A method as defined in claim 3 wherein the length of time for performing said oxidizing cycle is approximately thirty minutes.

12. A method as defined in claim 3 wherein the length of time for performing said passivating cycle is approximately forty-five minutes.

13. A method as defined in claim 2, wherein the lengths of time for which firstly nitrogen gas and then said gaseous mixture of nitrogen and oxygen are flowed over said disks and wafers is a total of approximately 150 minutes.

14. A method as defined in claim 3, wherein the lengths of time for which firstly nitrogen gas and then said gaseous mixture of nitrogen and oxygen are flowed over said disks and wafers is a total of approximately 150 minutes.

15. A method as defined in claim 2, wherein each of said boron disks and substrate wafers is disposed on a quartz boat within said reaction chamber, and said disks and wafers are separated from one another on said boat by a distance of approximately 0.09 inches.

16. A method as defined in claim 3, wherein each of said boron disks and substrate wafers is disposed on a quartz boat within said reaction chamber, and said disks and wafers are separated from one another on said boat by a distance of approximately 0.09 inches.

17. A method as defined in claim 2, further including the step of storing said disks at a temperature of 50° C. in an $N_2$ atmosphere flowing at a rate of approximately 8.0 slpm prior to performing said diffusion step.

18. A method as defined in claim 3, further including the step of storing said disks at a temperature of 50° C. in an $N_2$ atmosphere flowing at a rate of approximately 8.0 slpm prior to performing said diffusion step.

* * * * *